(12) United States Patent
Shibuya et al.

(10) Patent No.: US 11,960,103 B2
(45) Date of Patent: Apr. 16, 2024

(54) MICRO-LENS ARRAY, PROJECTION TYPE IMAGE DISPLAY DEVICE, METHOD FOR DESIGNING MICRO-LENS ARRAY, AND METHOD FOR MANUFACTURING MICRO-LENS ARRAY

(71) Applicant: DEXERIALS CORPORATION, Tokyo (JP)

(72) Inventors: Kazuyuki Shibuya, Tome (JP); Shunsuke Kanasugi, Tome (JP); Mitsuo Arima, Tagajo (JP); Naoki Hanashima, Tagajo (JP)

(73) Assignee: DEXERIALS CORPORATION, Tochigi (JP)

( * ) Notice: Subject to any disclaimer, the term of this patent is extended or adjusted under 35 U.S.C. 154(b) by 240 days.

(21) Appl. No.: 16/949,523

(22) Filed: Nov. 2, 2020

(65) Prior Publication Data

US 2021/0132262 A1    May 6, 2021

(30) Foreign Application Priority Data

Nov. 6, 2019  (JP) ................. 2019-201226

(51) Int. Cl.
| | | |
|---|---|---|
| *G02B 3/00* | (2006.01) | |
| *G02B 1/11* | (2015.01) | |
| *G02B 5/02* | (2006.01) | |
| *G02B 27/00* | (2006.01) | |
| *G03F 7/00* | (2006.01) | |

(52) U.S. Cl.
CPC ............. *G02B 3/0037* (2013.01); *G02B 1/11* (2013.01); *G02B 5/0268* (2013.01); *G02B 5/0278* (2013.01); *G02B 27/0012* (2013.01); *G03F 7/0005* (2013.01)

(58) Field of Classification Search
CPC ...... G02B 3/0037; G02B 1/11; G02B 5/0268; G02B 5/0278; G02B 27/0012; G03F 7/0005
USPC ......................................................... 359/741
See application file for complete search history.

(56) References Cited

U.S. PATENT DOCUMENTS

| | | | |
|---|---|---|---|
| 2015/0205014 A1 | 7/2015 | Akasaka | |
| 2017/0184954 A1* | 6/2017 | Koyanagi | ............ G02B 5/0221 |
| 2017/0235154 A1 | 8/2017 | Uchida et al. | |

FOREIGN PATENT DOCUMENTS

| | | |
|---|---|---|
| CN | 106461815 | 2/2017 |
| CN | 108351437 | 7/2018 |
| JP | 4845290 B2 | 12/2011 |

(Continued)

OTHER PUBLICATIONS

"Japanese Application Serial No. 2021-024218, Notice of Allowance dated Oct. 5, 2021", w English Translation, (Oct. 5, 2021), 4 pgs.

(Continued)

*Primary Examiner* — Wyatt A Stoffa
*Assistant Examiner* — Mitchell T Oestreich
(74) *Attorney, Agent, or Firm* — Schwegman Lundberg & Woessner, P.A.

(57) ABSTRACT

The micro-lens array is a micro-lens array in which a plurality of micro-lenses are arranged in a matrix in a plan view, wherein each of the plurality of micro-lenses has four main sides in a plan view, and each of the four main sides is inclined with respect to a row virtual line parallel to a row direction or a column virtual line parallel to a column direction.

4 Claims, 14 Drawing Sheets

(56) References Cited

FOREIGN PATENT DOCUMENTS

| JP | 2015057632 | | 3/2015 |
|----|------------|---|--------|
| JP | 2015129894 | | 7/2015 |
| JP | 2015169804 | | 9/2015 |
| JP | 2017083815 | A | 5/2017 |
| JP | 6841889 | | 2/2021 |
| WO | WO-2016051785 | A1 | 4/2016 |
| WO | WO-2016052359 | A1 | 4/2016 |
| WO | WO-2017043063 | A1 | 3/2017 |

OTHER PUBLICATIONS

"Japanese Application Serial No. 2019-201226, Notice of Allowance dated Jan. 19, 2021", w English Translation, (Jan. 19, 2021), 5 pgs.
"Japanese Application Serial No. 2019-201226, Office Action dated Mar. 17, 2020", w/ English Translation, (Mar. 17, 2020), 8 pgs.
"Japanese Application Serial No. 2021-179651, Office Action dated Dec. 6, 2022", w English Translation, (Dec. 6, 2022), 6 pgs.
"Chinese Application Serial No. 202011137442.2, Office Action dated Nov. 21, 2022", w English Translation, (Nov. 21, 2022), 17 pgs.

\* cited by examiner

MICRO-LENS ARRAY, PROJECTION TYPE IMAGE DISPLAY DEVICE, METHOD FOR DESIGNING MICRO-LENS ARRAY, AND METHOD FOR MANUFACTURING MICRO-LENS ARRAY

CROSS-REFERENCE TO RELATED APPLICATION

This application is based upon and claims the benefit of priority from Japanese Patent Application No. 2019-201226, Nov. 6, 2019; the entire contents of which are incorporated herein by reference.

FIELD

The present invention relates to a micro-lens array, a projection type image display device, a method for designing the micro-lens array, and a method for manufacturing the micro-lens array.

BACKGROUND

A diffusion plate diffuses incident light in various directions. The diffusion plate is used in various applications such as displays, projectors, and lighting. A micro-lens array can be used as a diffusion plate. The micro-lens array has irregularity in the form of a plurality of lenses on a surface thereof. Light incident on the micro-lens array is refracted and diffused by the irregularity on the surface.

For example, Patent Documents 1 and 2 describe a diffusion plate using a micro-lens array. Patent Document 1 describes a diffusion plate using a plurality of micro-lenses which have different cross-sectional shapes and have no axis of symmetry. Patent Document 2 describes a micro-lens array in which positions of vertices are displaced from a basic pattern.

PATENT DOCUMENTS

[Patent Document 1] PCT International Publication No. WO2016/051785
[Patent Document 2] Japanese Patent No. 4845290

SUMMARY

In a projector, light which has passed through the diffusion plate is applied to, for example, an integrator lens or an image display device. These members are quadrangular, and when the diffused light is circular, light utilization efficiency is reduced. Therefore, there is a demand for a diffusion plate which diffuses light into a quadrangle. On the other hand, when the light is diffused into a quadrangle, lenses are arranged periodically. A diffusion plate having a periodic structure may generate diffracted light or the like, and it is then difficult to uniformly diffuse light.

For example, in micro-lens arrays described in Patent Document 1 and Patent Document 2, lenses are arranged in a matrix, and light can be diffused into a quadrangle. However, as described in Patent Document 1, it is difficult to make the diffused light sufficiently homogeneous only by making the cross-sectional shapes of the lenses non-uniform. Further, for example, as described in Patent Document 2, it is difficult to uniformly diffuse light only by providing a deviation in the positions of the vertices of the lenses.

The present invention has been made in view of the above problems, and an object thereof is to provide a micro-lens array, a projection type image display device, a method for designing the micro-lens array, and a method for manufacturing the micro-lens array in which a variation in a diffusion intensity is small.

The present invention provides the following means to solve the above-described problems.

A micro-lens array according to a first aspect is a micro-lens array in which a plurality of micro-lenses are arranged in a matrix in a plan view, wherein each of the plurality of micro-lenses has four main sides in a plan view, and each of the four main sides is inclined with respect to a row virtual line parallel to a row direction or a column virtual line parallel to a column direction.

In the micro-lens array according to the above-described aspect, each of the plurality of micro-lenses may have one or more sub-sides which connect two main sides of the four main sides in a plan view.

In the micro-lens array according to the above-described aspect, an inclination angle θ of each of the four main sides with respect to the row virtual line or the column virtual line may be 2.5° or more and 36° or less.

In the micro-lens array according to the above-described aspect, each of the plurality of micro-lenses may be a concave lens which is recessed with respect to a reference surface.

The micro-lens array according to the above-described aspect may further include an antireflection film, and the antireflection film may be laminated on at least one of a first surface on which the plurality of micro-lenses are disposed and a second surface which faces the first surface.

A projection type image display device according to a second aspect includes the micro-lens array according to the above-described aspect.

A method for designing a micro-lens array according to a third aspect includes a first process of drawing a plurality of row virtual lines parallel to a row direction and a plurality of column virtual lines parallel to a column direction, and setting a basic pattern in which a plurality of micro-lenses curved with a center of a quadrangle surrounded by the row virtual lines and the column virtual lines as a vertex are arranged in a matrix, and a second process of varying two or more of the intervals between the row virtual lines and between the column virtual lines, the positions of the vertices of the respective micro-lenses, and the radii of curvature of the respective micro-lenses with respect to the basic pattern.

In the second process of the method for designing the micro-lens array according to the above-described aspect, the intervals between the row virtual lines and between the column virtual lines, the position of the vertex of each of the micro-lenses, and the radius of curvature of each of the micro-lenses are all varied with respect to the basic pattern.

A method for manufacturing the micro-lens array according to the above-described aspect includes coating a resist on a substrate, exposing the resist via a grayscale mask, and forming a resist pattern on a surface of the resist based on the method for designing a micro-lens array according to claim 7 or 8, and performing etching via the resist.

According to the micro-lens array of the above-described aspect, it is possible to curb variation in a diffusion intensity of diffused light.

According to the projection-type image display device of the above-described aspect, it is possible to improve light utilization efficiency.

According to the methods for designing and manufacturing the micro-lens array according to the above-described aspect, it is possible to obtain a micro-lens array in which the variation in the dispersion intensity of the diffused light is small.

DETAILED DESCRIPTION

Figure 1:
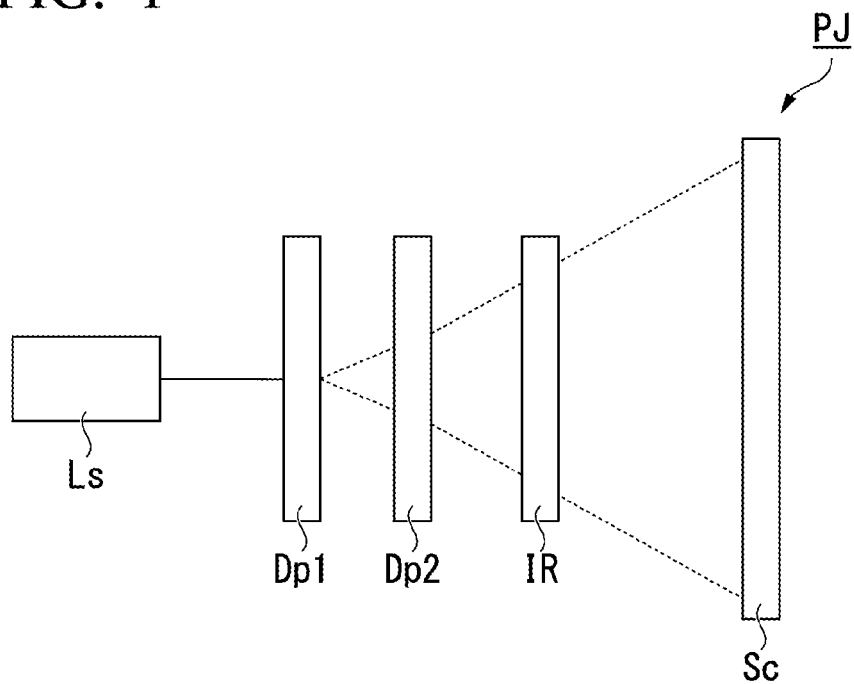
FIG. 1 is a schematic diagram of a projection type image display device according to a first embodiment.

Hereinafter, embodiments will be described in detail with reference to the drawings as appropriate. In the drawings used in the following description, in order to make the features easy to understand, characteristic parts may be enlarged for convenience, and dimensional ratios of components may be different from actual ones. Materials, dimensions, and the like provided in the following description are exemplary examples, and the present invention is not limited thereto and can be appropriately modified and implemented within the range in which effects of the present invention are exhibited.

"Projection Type Image Display Device"

FIG. 1 is a schematic diagram of a projection type image display device PJ according to a first embodiment. The projection type image display device PJ is, for example, a projector. The projection type image display device PJ includes, for example, a light source Ls, diffusion plates Dp1 and Dp2, an integrator lens IR, and a screen Sc.

The light source Ls is, for example, a lamp or a laser. As the laser, blue, green, and red lasers may be respectively prepared, or yellow, green, and red may be produced by irradiating a phosphor with a blue laser.

The diffusion plates Dp1 and Dp2 diffuse light from the light source Ls. The diffusion plates Dp1 and Dp2 are, for example, diffusion plates on which a plurality of micro-lens arrays are arranged. Details of the micro-lens array will be described later. Since there are two or more diffusion plates Dp1 and Dp2 between the light source Ls and the screen Sc, unevenness of light projected on the screen Sc is reduced. Preferably, a shape of the integrator lens IR and an image projected on the screen Sc are quadrangular, and the diffusion plates Dp1 and Dp2 diffuse the light in a quadrangular shape.

The integrator lens IR is a lens which enhances uniformity of illuminance on an irradiation surface. Accuracy of the image projected on the screen Sc is enhanced by the light passing through the integrator lens IR.

"Micro-Lens Array"

Figure 2:
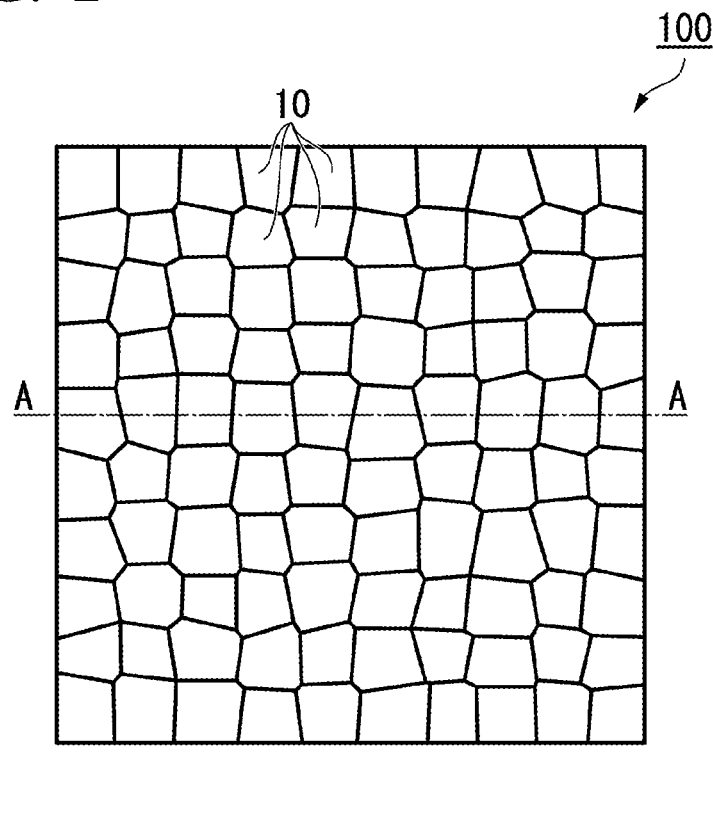
FIG. 2 is a plan view of a micro-lens array according to the first embodiment.
Figure 3:
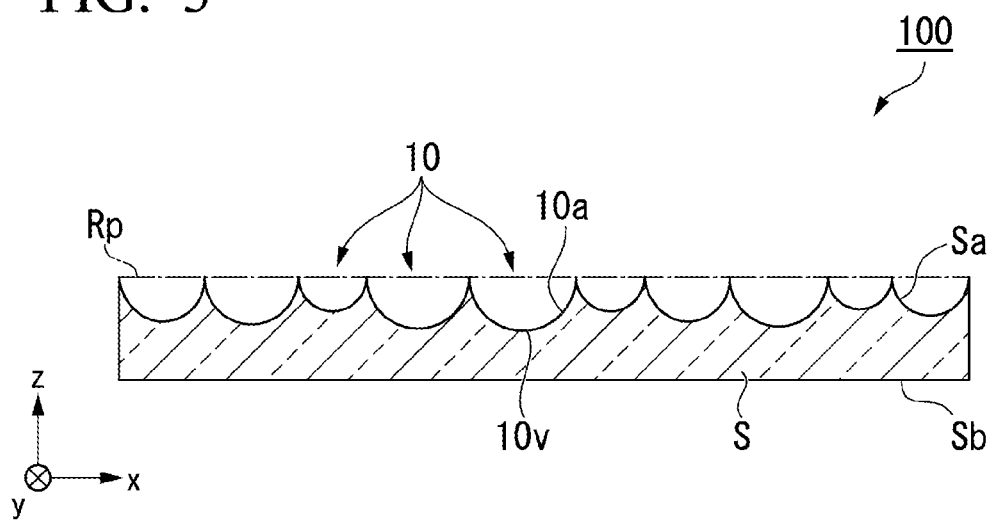
FIG. 3 is a cross-sectional view of the micro-lens array according to the first embodiment.

FIG. 2 is a plan view of a micro-lens array 100 according to the first embodiment. Further, FIG. 3 is a cross-sectional view of the micro-lens array 100 according to the first embodiment. FIG. 3 is a cross section of the micro-lens array 100 taken along line A-A in FIG. 2. For example, the above-described diffusion plates Dp1 and Dp2 are obtained by arranging a plurality of micro-lens arrays 100 regularly.

Here, directions are defined. A plane in which the micro-lens array 100 spreads is defined as an xy plane, one direction thereof is defined as an x direction, and a direction orthogonal to the x direction is defined as a y direction. Each of the x direction and the y direction is one direction in which micro-lenses 10 forming the micro-lens array 100 are arranged. The x direction is an example of a row direction, and the y direction is an example of a column direction. The z direction is a direction orthogonal to the xy plane. The z direction is also a direction in which light is incident on the micro-lens array 100.

In the micro-lens array 100, a plurality of micro-lenses 10 are arranged in a matrix in a plan view in the z direction. Arranging in a matrix means that the micro-lenses 10 are arranged in the x direction and the y direction. A main vector direction of a line connecting vertices of the adjacent micro-lenses 10 is the x direction or the y direction. The size of one micro-lens 10 is, for example, about 100 μm.

The plurality of micro-lenses 10 are formed on one surface of a substrate S. Hereinafter, a surface of the substrate S on the side on which the micro-lenses 10 are arranged is referred to as a first surface Sa, and a surface which faces the first surface Sa is referred to as a second surface Sb. The substrate S is, for example, a substrate which is transparent to a wavelength band of incident light. The substrate S is, for example, optical glass, crystal, sapphire, a resin plate, or a resin film. The optical glass is, for example, quartz glass, borosilicate glass, white plate glass, or the like. The resin is, for example, polymethylmethacrylate (PMMA), polyethylene terephthalate (PET), polycarbonate (PC), cyclic olefin copolymer (COC), or the like. Inorganic materials such as optical glass, quartz and sapphire have excellent light resistance. Also, crystal and sapphire have excellent heat dissipation. The shape of the substrate S in a plan view in the z direction does not matter.

Each of the plurality of micro-lenses 10 is, for example, a concave lens which is recessed with respect to a reference plane Rp. Each of the plurality of micro-lenses 10 may be, for example, a convex lens which protrudes with respect to the reference plane Rp. The reference surface Rp is a surface parallel to the xy plane (for example, the second surface Sb) and is a surface which is in contact with the furthest protruding portion of the first surface Sa. The reference plane Rp is, for example, a surface of the substrate S before processing.

A surface of each of the micro-lenses 10 is a curved surface 10a. Light is refracted by the curved surface 10a, and thus the incident light is diffused. The radius of curvature of each of the curved surfaces 10a is different, for example. The radius of curvature of each of the curved surfaces 10a is, for example, 50% or more and 150% or less based on the average radius of curvature. The curvature of each of the curved surfaces 10a may be, for example, 70% or more and 130% or less based on the average radius of curvature.

A maximum point or a minimum point of the curved surface 10a is referred to as a vertex 10v. When the micro-lens 10 is a concave lens, the minimum point of the curved surface 10a is the vertex 10v, and when the micro-lens 10 is a convex lens, the maximum point of the curved surface 10a is the vertex 10v. The distance between the vertex 10v of each of the micro-lenses 10 and the reference plane Rp is not constant, for example.

Figure 4:
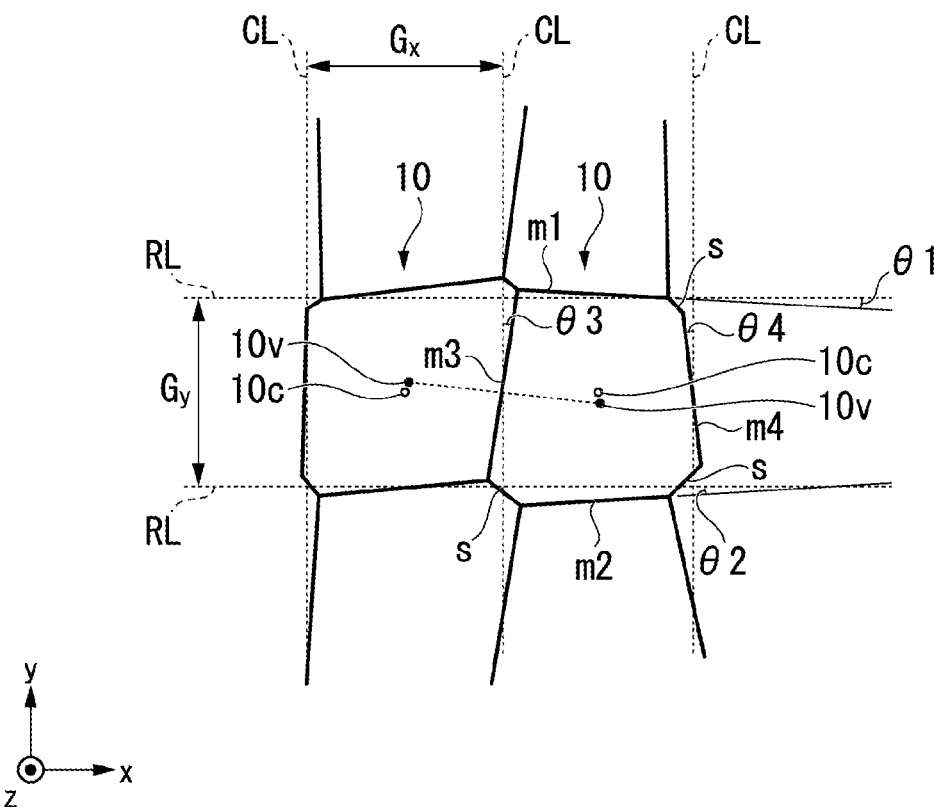
FIG. 4 is an enlarged plan view of a characteristic part of the micro-lens array according to the first embodiment.

FIG. 4 is an enlarged plan view of a characteristic part of the micro-lens array 100 according to the first embodiment. The respective micro-lenses 10 are arranged along a basic pattern in the x direction and the y direction. The basic pattern is a pattern in which quadrangles partitioned by a plurality of row virtual lines RL and a plurality of column virtual lines CL are arranged in the x direction and the y direction. The row virtual line RL is a virtual line parallel to the x direction, and the column virtual line CL is a virtual line parallel to the y direction. An interval $G_x$ between the respective column virtual lines CL is constant, and an interval $G_y$ between the respective row virtual lines RL is constant. Each of the intervals $G_x$ and $G_y$ is several μm to several tens μm, for example, 1 μm or more and 100 μm or less. One micro-lens 10 is arranged in each of the quadrangles of the basic pattern. The quadrangles defined by the row virtual line RL and the column virtual line CL may be square or rectangular.

A shape of each of the micro-lenses 10 in a plan view in the z direction is a polygon having four main sides m1, m2, m3, and m4. The polygon includes, for example, four main sides m1, m2, m3, m4 and one or more sub-sides s. The sub-side s is a connecting portion which connects two main sides. For example, the main side m1 and the main side m4 shown in FIG. 4 are connected by the sub-side s. The main sides m1, m2, m3, m4 and the sub-sides s are boundaries between adjacent micro-lenses 10 and are linear regions in which the curvature of the micro-lenses 10 changes rapidly. When the micro-lens 10 is a concave lens, the boundary is a ridge, and when the micro-lens 10 is a convex lens, the boundary is a valley. The main sides m1, m2, m3, m4 and the sub-sides s may be curved in the z direction.

Among the four main sides m1, m2, m3, and m4, the main sides m1 and m2 extend in the x direction, and the main sides m3 and m4 extend in the y direction. In the specification, "extending in the x direction" means that the length in the x direction is longer than the length in the y direction on the xy plane, for example. The length of each of the main sides m1, m2, m3, and m4 is longer than that of the sub-side s. The length of the main sides m1 and m2 is, for example, 50% or more and 150% or less of the interval $G_x$ between the adjacent column virtual lines CL, and the length of the main sides m3 and m4 is, for example, 50% or more and 150% or less of the interval $G_y$ between the adjacent row virtual lines RL.

At least one main side of the four main sides m1, m2, m3, and m4 is inclined with respect to the row virtual line RL or the column virtual line CL. Each of the four main sides m1, m2, m3, and m4 may be inclined with respect to the row virtual line RL or the column virtual line CL. The main sides m1 and m2 are inclined with respect to the row virtual row line RL. The main side m1 is inclined at an inclination angle θ1 with respect to the row virtual line RL, for example. The main side m2 is inclined at an inclination angle θ2 with respect to the row virtual line RL, for example. The main sides m3 and m4 are inclined with respect to the column virtual line CL. The main side m3 is inclined at an inclination angle θ3 with respect to the column virtual line CL, for example. The main side m4 is inclined at an inclination angle θ4 with respect to the column virtual line CL, for example. The inclination angles θ1, θ2, θ3, and θ4 are different from each other.

At least one of the inclination angles θ1, θ2, θ3, and θ4 is 2.5° or more and 36° or less. The inclination angles θ1, θ2, θ3, and θ4 are all 2.5° or more and 36° or less, for example. The average value of the inclination angles θ1, θ2, θ3, and θ4 is, for example, 19.3°. When the inclination angles θ1, θ2, θ3, and θ4 are within these ranges, variation in a diffusion intensity of diffused light after the light passes through the micro-lens array 100 is reduced.

Further, in a plan view in the z direction, the vertex 10v of each of the micro-lenses 10 may be shifted from a center 10c of the quadrangle defined by the row virtual line RL and the column virtual line CL. The shift amount with respect to the center 10c of the vertex 10v in the x direction is, for example, within 50% of the interval $G_x$ between adjacent column virtual lines CL and may be within 30%. A shift amount with respect to the center 10c of the vertex 10v in the y direction is, for example, within 50% of the interval $G_y$ between adjacent row virtual lines RL and may be within 30%.

In the micro-lens array 100 according to the first embodiment, each of the micro-lenses 10 has the four main sides m1, m2, m3, and m4, and thus the diffused light has a quadrangular shape. Further, since each of the main sides m1, m2, m3, m4 is inclined with respect to the column virtual line CL or the row virtual line RL, it is possible to curb variation in the diffusion intensity of the diffused light.

Moreover, since the micro-lens 10 has the sub-side s, it is possible to further curb variation in the diffusion intensity while the shape of the diffused light is maintained in the quadrangle. When the micro-lens 10 has the sub-side s, a position at which the micro-lens 10 is arranged does not significantly deviate from the quadrangle of the basic pattern defined by the row virtual line RL and the column virtual line CL. The shape of the diffused light can be maintained in the quadrangle by the micro-lens 10 maintaining the arrangement of the basic pattern, and the variation in the diffusion intensity of the diffused light can be curbed by each of the sides being inclined with respect to the column virtual line CL or the row virtual line RL which forms the basic pattern.

Although the first embodiment has been described above in detail, the present invention is not limited to the example, and various modifications and changes can be made within the scope of the gist of the present invention described in the claims.

Figure 5:
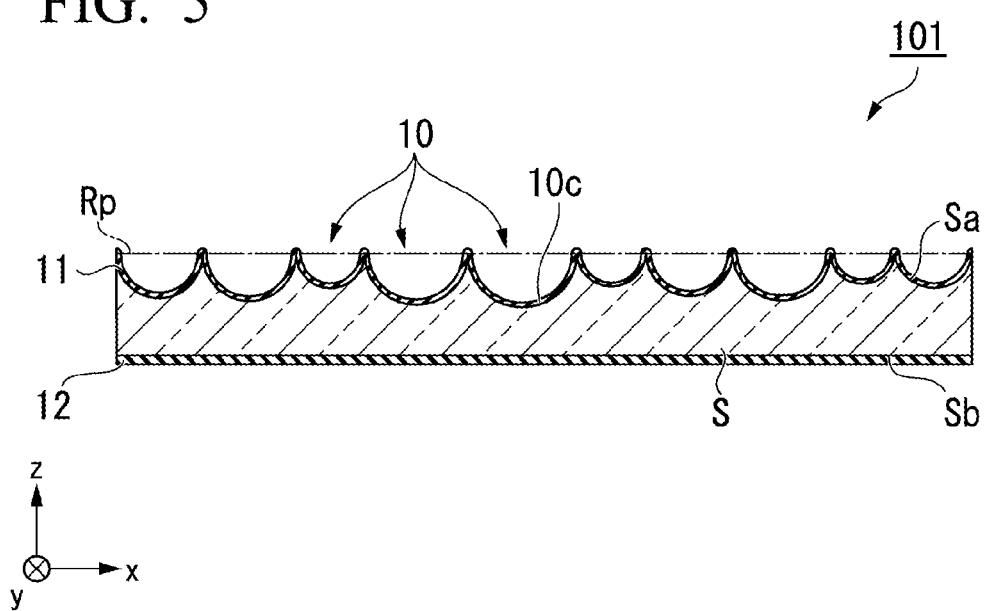
FIG. 5 is a cross-sectional view of a micro-lens array according to a first modified example.

For example, FIG. 5 is a cross-sectional view of a micro-lens array 101 according to a first modified example.

The micro-lens array 101 is different from the micro-lens array 100 shown in FIG. 3 in that it has antireflection films 11 and 12. In the micro-lens array 101, components the same as those of the micro-lens array 100 shown in FIG. 3 are designated by the same reference numerals, and the description thereof will be omitted.

The antireflection film 11 covers the first surface Sa of the substrate S. The antireflection film 12 covers the second surface Sb of the substrate S.

The antireflection films 11 and 12 are, for example, laminated films in which a low refractive index layer and a high refractive index layer are laminated. The low refractive index layer is, for example, $SiO_2$, $MgF_2$, or $CaF_2$. The high refractive index layer is, for example, $Nb_2O_5$, $TiO_2$, $Ta_2O_5$, $Al_2O_3$, $HfO_2$, or $ZrO_2$. $SiO_2$, $Nb_2O_5$, and $Ta_2O_5$ have excellent light resistance and are not easily deteriorated even when they are irradiated with light having a high optical density emitted by a high-power laser or the like.

Although FIG. 5 illustrates the case in which the antireflection films 11 and 12 are provided on both surfaces of the substrate S, the antireflection film may be provided on only one of the surfaces. Further, the antireflection film may have a moth-eye structure in which fine irregularities having a pitch of several hundred nm are arranged.

The micro-lens array 101 according to the first modified example has the same constitution as that of the micro-lens array 100 according to the first embodiment and thus exhibits the same effect as that of the micro-lens array 100 according to the first embodiment. Further, since the antireflection films 11 and 12 are provided, interface reflection can be curbed, and reflected stray light can be curbed.

Also, although the case in which the micro-lens arrays 100 and 101 are used in the projection type image display device PJ has been described above as an example, the micro-lens arrays 100 and 101 may be used for other purposes. For example, the micro-lens arrays 100 and 101 may be used for an illuminating device, or the like.

"Method for Manufacturing Micro-Lens Array"

Figure 6:
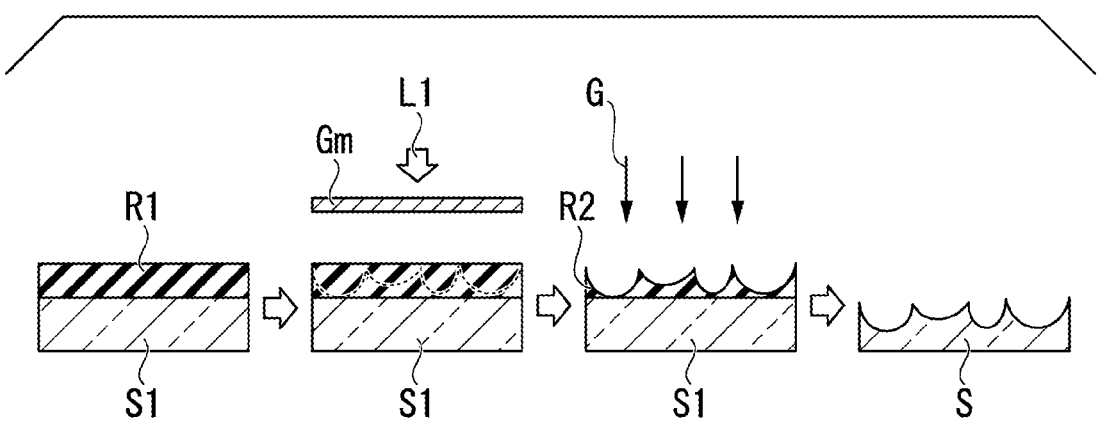
FIG. 6 is a diagram showing a method for manufacturing the micro-lens array according to the first embodiment.

FIG. 6 is a diagram showing a method for manufacturing the micro-lens array according to the first embodiment. The method for manufacturing the micro-lens array includes a resist coating process, an exposure/development process, and an etching process.

First, in the resist coating process, a resist R1 is coated on the substrate S1. The substrate S1 is formed of the same material as that of the substrate S because it becomes the above-described substrate S by processing. In the etching process which will be described later, a fluorine-based etching gas ($CF_4$, $SF_6$, $CHF_3$, or the like) may be used as an etching gas. $Al_2O_3$, alkali metals or the like may react with the fluorine-based etching gas and may become non-volatile substances. For example, when a glass substrate (for example, Eagle XG manufactured by Corning) containing no alkali metals but containing 27% of $Al_2O_3$ is etched with a fluorine-based etching gas, $Al_2O_3$ which is difficult to be etched remains, minute projections are generated on the surface, and a transmittance of the glass substrate is reduced. A content of an alkali component in the substrate S1 is preferably 20% or less by mass, and more preferably 10% or less by mass. The substrate S1 is preferably quartz glass or Tempax glass, for example. A known resist can be applied to the resist R1.

Next, in the exposure process, the resist R1 is irradiated with light L1 via a grayscale mask Gm to expose the resist R1. The exposure is, for example, step-and-repeat exposure in which exposure is repeated while the grayscale mask is moved. A seam with a maximum width of several μm may be generated between basic cells formed by one exposure according to positional accuracy of stepping. In order to avoid such a problem, it is preferable to perform the exposure so that the basic cells overlap each other. When the basic cells overlap each other greatly, an exposure amount may be adjusted to obtain a desired exposure amount by a plurality of exposures.

Next, in the development process, an exposed resist pattern is developed. A part of the resist R1 is removed by the development, and a resist R2 having a resist pattern is formed on a surface thereof. A resist pattern similar to the desired micro-lens array is formed on the surface of the resist R2. A method for designing the resist pattern into a desired pattern of the micro-lens array will be described in detail later.

Next, in the etching process, the substrate S1 is thy-etched through the resist R2. Dry etching is performed using, for example, a reactive gas G. The gas G is, for example, the above-described fluorine-based etching gas. The pattern of the micro-lens array formed on the surface of the resist R2 by dry etching is transferred to the substrate S1. The substrate S1 becomes the substrate S having the micro-lens array formed on the first surface Sa.

In the case of the micro-lens array 101 shown in FIG. 5, thereafter, the antireflection films 11 and 12 are formed. The antireflection films 11 and 12 are formed by, for example, vapor deposition, sputtering or the like.

"Method for Designing Micro-Lens Array"

Figure 7:
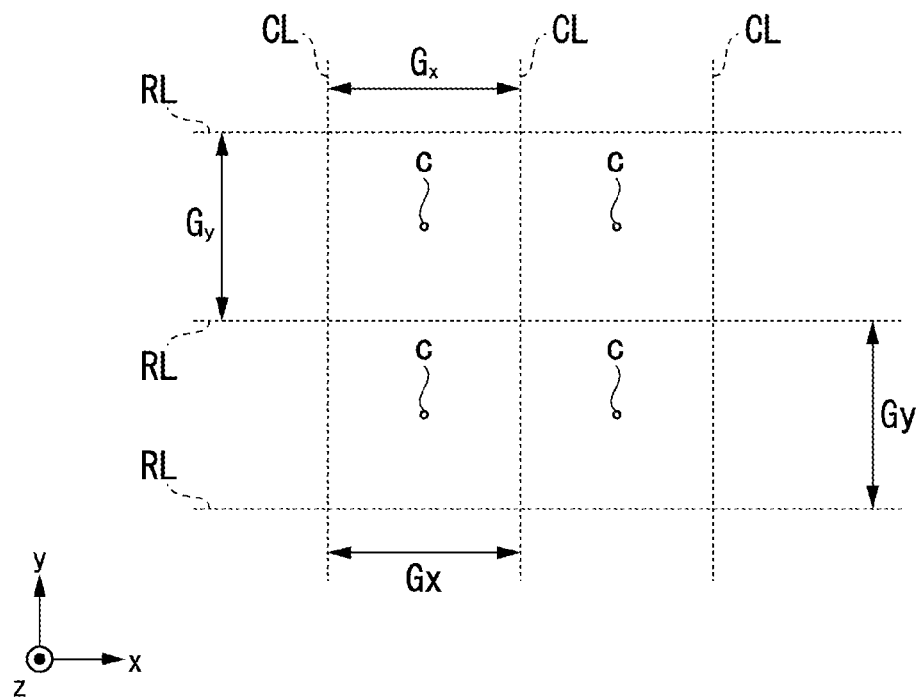
FIG. 7 is a diagram showing a method for designing the micro-lens array according to the first embodiment.
Figure 8:
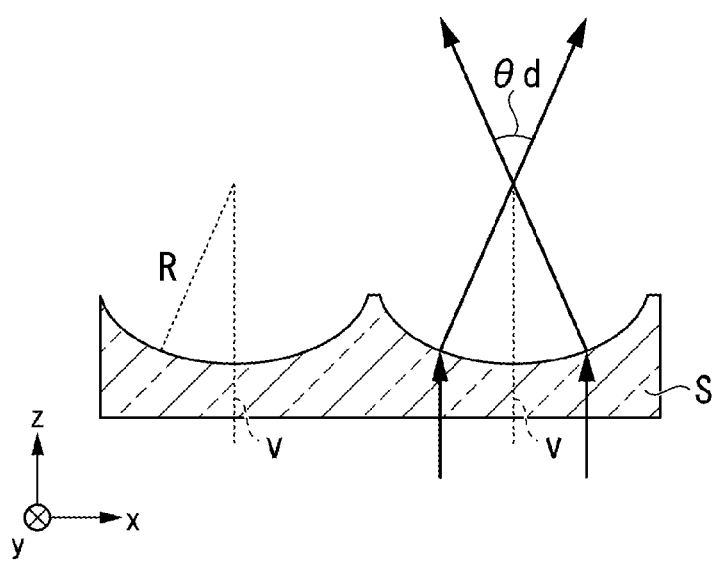
FIG. 8 is a diagram showing the method for designing the micro-lens array according to the first embodiment.

The method for designing the micro-lens array is divided into a first process, a second process, and a third process. The first process is a process of setting the basic pattern. The second process is a process of setting a pattern in which various conditions are varied with respect to the basic pattern. The third process is a process of selecting etching conditions. Hereinafter, each of the processes will be described with reference to FIGS. 7 and 8. FIGS. 7 and 8 are diagrams showing the method of designing the micro-lens array according to the first embodiment.

First, as shown in FIG. 7, the basic pattern is set in the first process. First, a plurality of row virtual lines RL and a plurality of column virtual lines CL are drawn, and an array pattern in which quadrangles surrounded by the row virtual lines RL and the column virtual lines CL are arranged is set. Next, as shown in FIG. 8, a radius of curvature R of the micro-lens is determined according to a diffusion angle θd required for the micro-lens array. The radius of curvature R and the diffusion angle θd satisfy the following relationship.

$$\theta d = 2 \sin^{-1}\{(p(n-1)/2R)$$

In the above equation, p is the distance $G_x$ between adjacent column virtual lines CL or the distance $G_y$ between adjacent row virtual lines RL. n is a refractive index of the substrate S.

Next, a center c of each of the quadrangles of the array pattern is set to be the vertex v of the micro-lens. A basic pattern in which micro-lenses having a predetermined curvature are arranged in a matrix is set by such a procedure. FIGS. 7 and 8 are examples of the set basic pattern.

Next, in the second process, some parameters are varied based on the basic pattern set in the first process. The parameters to be varied with respect to the basic pattern are two or more of the intervals $G_x$ and $G_y$ between the row virtual lines RL and between the column virtual lines CL, respectively, the position of the vertex of each of the micro-lenses, and the radius of curvature of each of the micro-lenses. All these parameters may be shifted.

An interval $G_x'$ between the adjacent column virtual lines CL is varied based on the interval $G_x$ between the column virtual lines CL in the basic pattern. An interval $G_y'$ between the adjacent row virtual lines RL is varied based on the interval $G_y$ between the row virtual lines RL in the basic pattern. When the interval $G_x'$ between the adjacent column virtual lines CL and the interval $G_y'$ between the adjacent row virtual lines RL are varied, the length of each of the sides of the quadrangle in a shift pattern is varied with respect to the length of each of the sides of the quadrangle in the basic pattern.

The interval $G_x'$ between the adjacent column virtual lines CL satisfies the following relationship. $g_x$ is the degree of variation, $g_x \geq 0\%$, and preferably $0\% < g_x \leq 50\%$.

$$G_x' = G_x \pm G_x \times g_x$$

Further, the interval $G_y'$ between the adjacent column virtual lines RL satisfies the following relationship. $g_y$ is the degree of variation, $g_y \geq 0\%$, and preferably $0\% < g_y \leq 50\%$.

$$G_y' = G_y \pm G_y \times g_y$$

The position of the vertex v of each of the micro-lenses is varied with respect to a position of the center c of each of the quadrangles of the basic pattern. A variation amount in the x direction with respect to the center c of each of the quadrangles of the basic pattern of the vertex v of the micro-lens is represented by $G_x \times T_x$, and a variation amount in the y direction is represented by $G_y \times T_y$. $T_x$ and $T_y$ are degrees of variation and satisfy $0\% \leq T_x$ and $T_y \leq 50\%$, and preferably $0\% < T_x$ and $T_y \leq 50\%$.

The radius of curvature of each of the micro-lenses is varied based on the radius of curvature R of the micro-lens set in the basic pattern. The variation amount of the radius of curvature is represented by $R \times r$. r is the degree of variation and satisfies $0\% \leq r \leq 50\%$ and preferably $0\% < r \leq 50\%$.

According to the above-described procedure, the shift pattern in which various parameters are varied within the above-described range with respect to the basic pattern is laid out. The layout is performed on the basis of a known lens arrangement calculation algorithm. Then, it is determined whether or not the laid-out shift pattern satisfies a desired plan view pattern of the micro-lens array. The desired plan view pattern of the micro-lens array is a pattern of the micro-lens array which satisfies the above-described constitution. When it is determined that the shift pattern satisfies the desired plan view pattern of the micro-lens array, the procedure proceeds to the third process. When it is determined that the shift pattern does not satisfy the desired plan view pattern of the micro-lens array, the procedure returns to the second process again to adjust a variation amount of various parameters. As a result, the plan view pattern of the micro-lens array is determined by the first process and the second process.

Next, in the third process, the etching condition is selected. The etching condition to be set is a ratio of an etching rate of the substrate S1 to an etching rate of the resist R2 in the etching process ("the etching rate of the substrate S1"/"the etching rate of the resist R2"). Hereinafter, the ratio of the etching rate of the substrate S1 to the etching rate of the resist R2 is referred to as an etching selection ratio. The etching selection ratio is adjusted by, for example, a flow rate ratio of a plurality of etching gases used for etching, or the like.

For example, when $CF_4$, Ar, and $O_2$ are used as the etching gases, and a ratio of a flow rate of the $CF_4$ gas to a flow rate of the Ar gas ("the flow rate of the $CF_4$ gas"/"the flow rate of the Ar gas") is changed from 0.25 to 4.0, the etching selection ratio is changed 1.0 to 1.7. When the $O_2$ gas is added in a range of 3% to 10% in this state, the etching selection ratio is reduced to 0.7 or more and 1.0 or less. That is, the etching selection ratio can be set in a range of 0.7 or more and 1.7 or less. In this case, the radius of curvature of the micro-lens array formed on the substrate S can be adjusted within a range of 70% or more and 170% or less with respect to the radius of curvature of the resist pattern formed on the surface of the resist R2.

As described above, a processing depth of the substrate S1 in the dry etching can be changed by changing the etching selection ratio. When the etching selection ratio is η and an expected depth of the micro-lens is S, a depth of the micro-lens actually formed is approximated to η×S. Further, when the radius of curvature of the resist pattern is $R_r$, the radius of curvature of the actually formed micro-lens is $R_r/η$. In the third process, the etching conditions are selected based on the above relationship.

A desired micro-lens array can be manufactured through the above-described procedure. That is, with the methods for designing and manufacturing the micro-lens array according to the embodiment, it is possible to obtain the micro-lens array in which the variation in the diffusion intensity of the diffused light are small.

EXAMPLES

Figure 9:
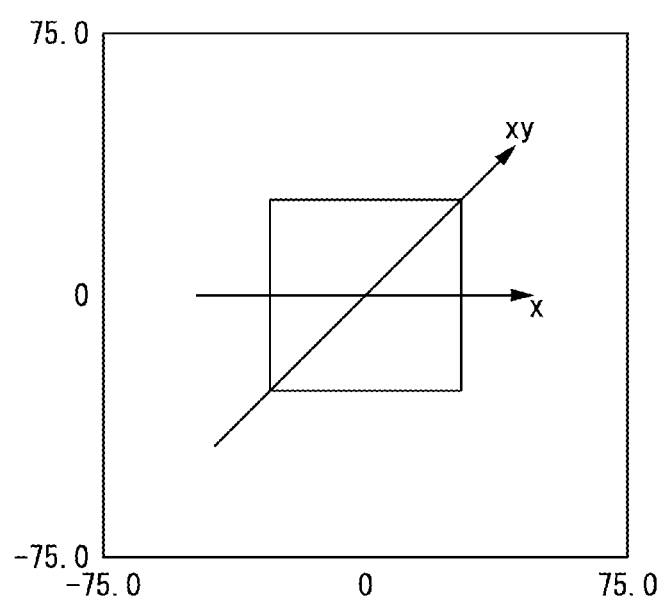
FIG. 9 is a schematic diagram showing an evaluation method of the micro-lens array according to Examples 1 to 6 and Comparative Example 1.

In Examples 1 to 6 and Comparative Examples 1 and 2 below, micro-lens arrays were designed under predetermined conditions, and diffusion characteristics of the obtained micro-lens arrays were obtained by simulation. The simulation was performed using Zemax's OpticStudio. The diffusion characteristic is the intensity distribution of diffused light in a detector placed at a distance of 200 mm and having a side of 150 mm while incident light having an intensity of 1 W and a spot diameter of 0.6 mm is applied to a center of the manufactured micro-lens array. The incident light was coherent parallel light with a wavelength of 450 nm. The diffusion characteristic was obtained in each of the x direction and an xy direction as shown in FIG. 9. The xy direction is a direction inclined by 45° with respect to each of the x direction and they direction. FIG. 9 is a schematic diagram showing an evaluation method of the micro-lens array according to Examples 1 to 6 and Comparative Example 1.

Comparative Example 1

In Comparative Example 1, a micro-lens array having the basic pattern was designed. One micro-lens was a square concave lens with one side of 80 μm. The radius of curvature of the micro-lens was 150 μm, and the refractive index of the substrate for light having a wavelength of 450 nm was 1.47. Ten micro-lenses were arranged in each of the x direction and the y direction to manufacture a matrix-arranged micro-lens array.

Figure 10:
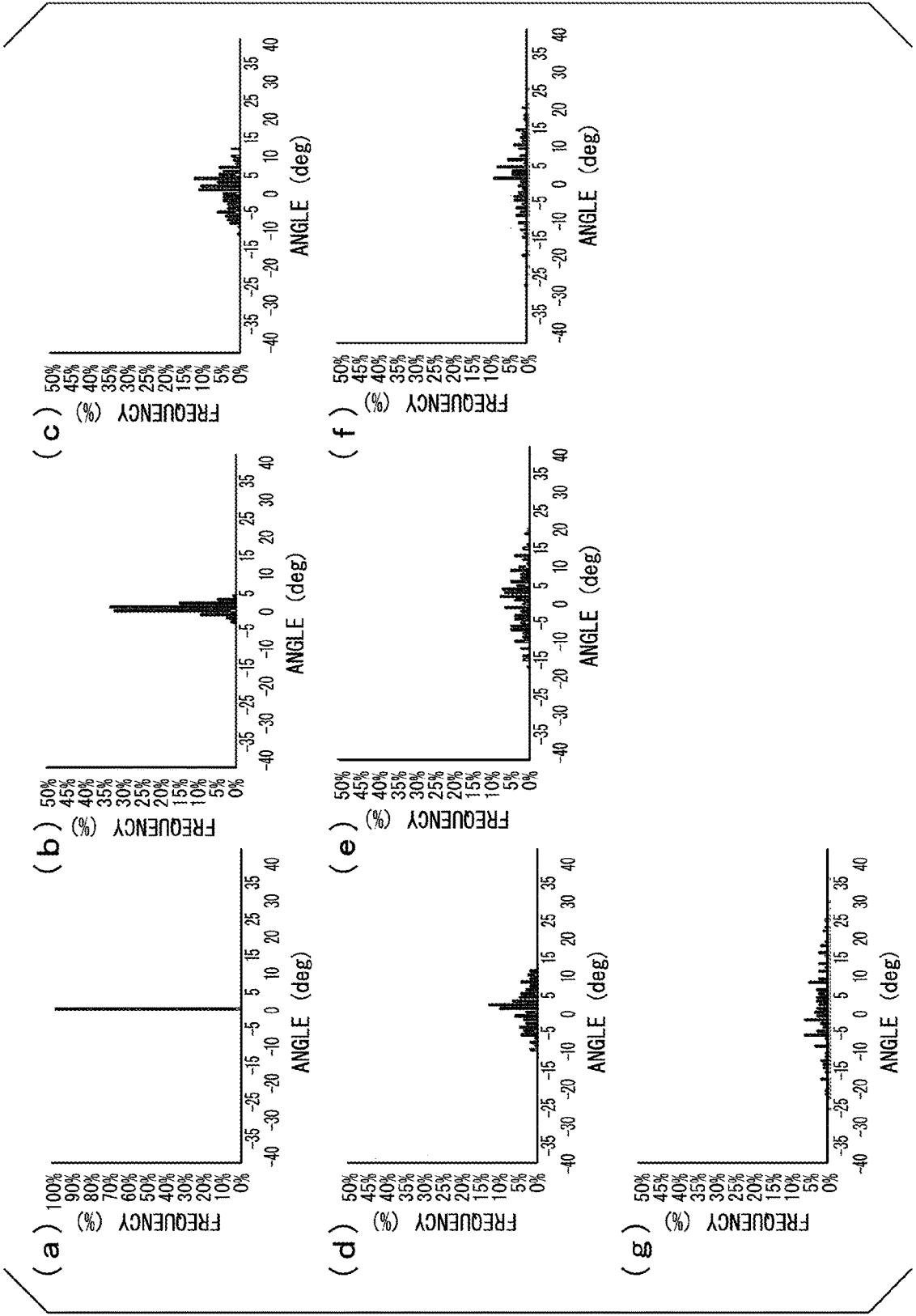
FIG. 10 is a distribution diagram of inclination angles of a main side of the micro-lens array according to Examples 1 to 6 and Comparative Example 1 with respect to a virtual row line or a virtual column line.

The shape of the micro-lens in a plan view is square and includes only main sides. Each of the main sides was parallel to the row virtual line or the column virtual line, and the inclination angles θ1, θ2, θ3, and θ4 with respect to the row virtual line or the column virtual line were 0°. The (a) of the FIG. 10 is a distribution diagram of the inclination angles of the main side of the micro-lens array according to Comparative Example 1 with respect to the row virtual line or the column virtual line.

Figure 11:
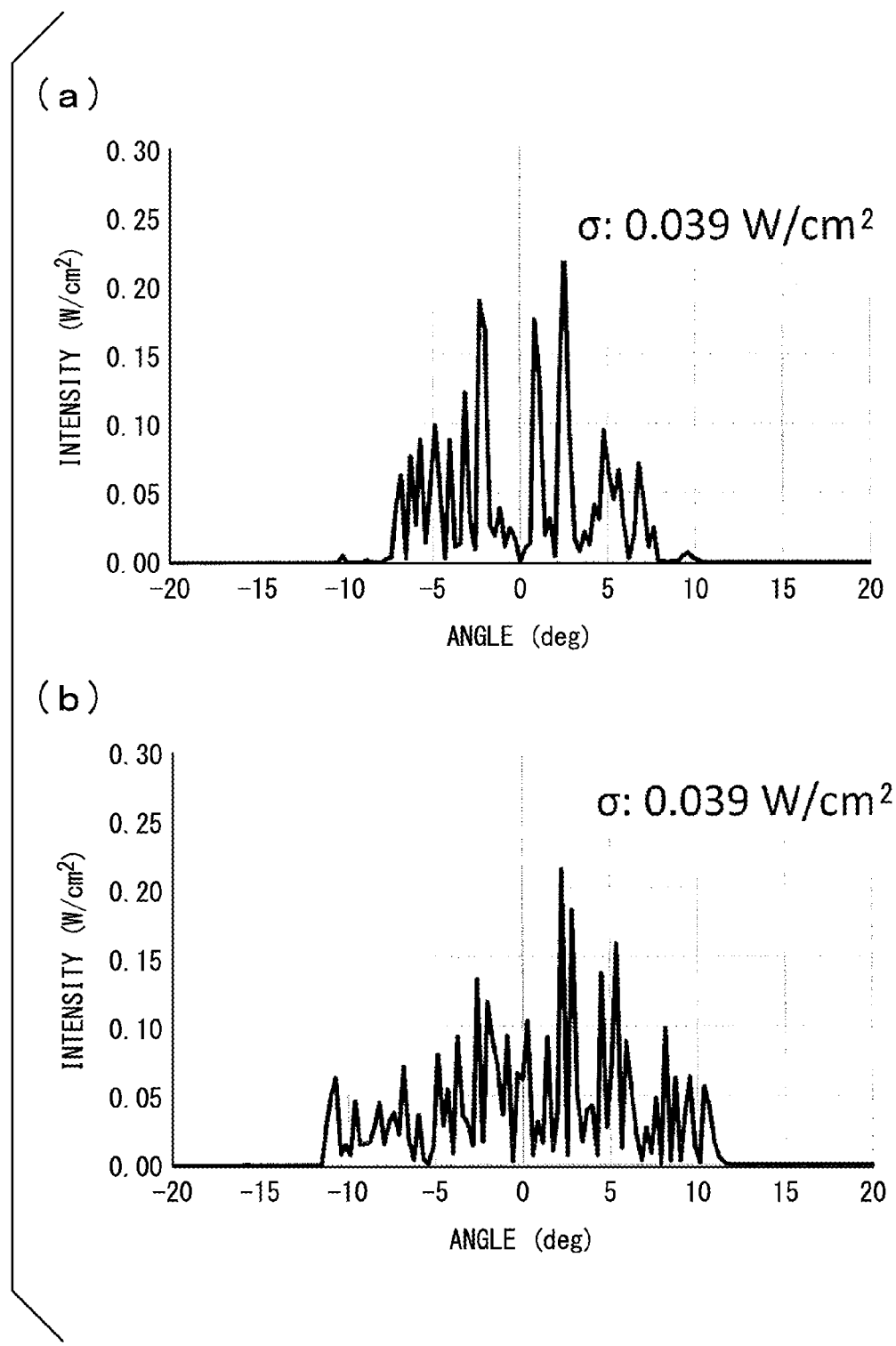
FIG. 11 is diffusion characteristics of the micro-lens array according to Comparative Example 1.

FIG. 11 shows the diffusion characteristics of the micro-lens array according to Comparative Example 1. The (a) of the FIG. 11 shows the diffusion characteristics in the x direction, and the (b) of the FIG. 11 shows the diffusion characteristics in the xy direction. The horizontal axis is an angle with respect to the incident light, and the vertical axis is the intensity of the diffused light. Standard deviations $\sigma_x$ and $\sigma_{xy}$ of the diffusion intensity in the x direction and the xy direction were both 0.039 W/cm². Further, a 10% angle width of the diffused light was obtained. The 10% angle width is a range of angles in which the intensity distribution is fitted with a Gaussian function and the intensity is 10% or more of the maximum intensity in a fitting curve. The 10% angle width in the x direction was 15.6°, and the 10% angle width in the xy direction was 22.9°. A ratio of the 10% angle width in the x direction to the 10% angle width in the xy directions was 0.68.

Examples 1 to 6

In Examples 1 to 6, the intervals between the row virtual lines RL and between the column virtual lines CL, the positions of the vertices of the respective micro-lenses, and the radii of curvature of the respective micro-lenses were all varied based on the basic pattern. The refractive index of the substrate for light having a wavelength of 450 nm was 1.47, as in Comparative Example 1. Examples 1 to 6 have different degrees of variation. Each of the micro-lenses of Examples 1 to 6 was a polygon having four main sides and sub-sides in a plan view.

In Example 1, the degrees of variation $g_x$ and $g_y$ of the column virtual line and the row virtual line were set to 5%, the degrees of variation $T_x$ and $T_y$ of the vertex position in the x and y directions were set to 5%, and the degree of variation r in the radius of curvature of the micro-lens was set to 5%.

The (b) of the FIG. 10 is a distribution diagram of the inclination angle of the main side of the micro-lens array according to Example 1 with respect to the row virtual row line or the column virtual column line. In Example 1, the inclination angles θ1, θ2, θ3, and θ4 of the main side with respect to the row virtual line or the column virtual line were within a range of −3.7° or more and 3.7° or less.

Figure 12:
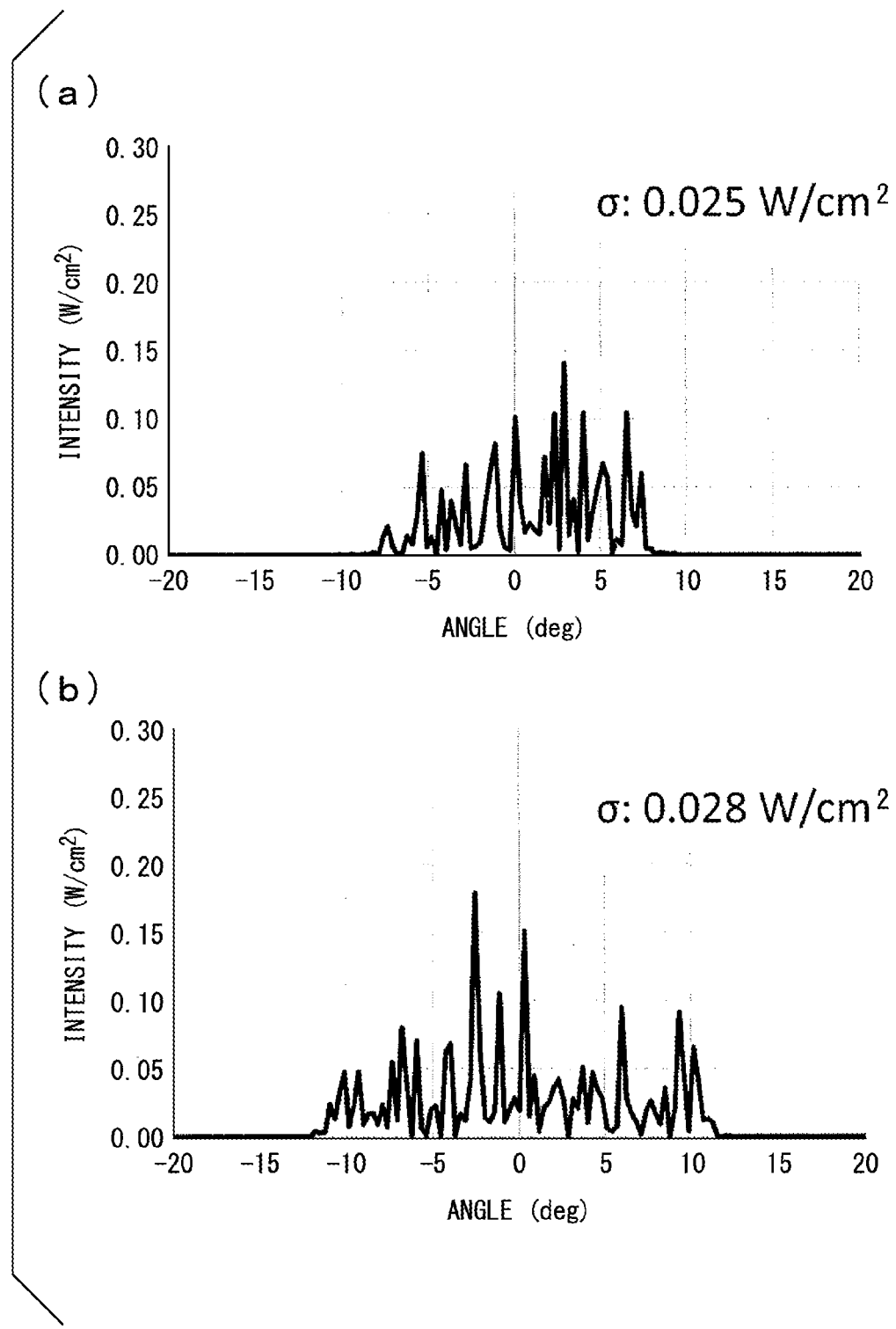
FIG. 12 is a diffusion characteristic of the micro-lens array according to Example 1.

FIG. 12 is a diffusion characteristic of the micro-lens array according to Example 1. The (a) of the FIG. 12 shows the diffusion characteristics in the x direction, and the (b) of the FIG. 12 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.025 W/cm², and the standard deviation $\sigma_{xy}$ of the diffusion intensity in the xy direction was 0.028 W/cm². Further, the 10% angle width in the x direction was 16.2°, and the 10% angular width in the xy direction was 22.7°. The ratio of the 10% angle width in the x direction to the 10% angle width in the xy directions was 0.71.

In Example 2, the degrees of variation $g_x$ and $g_y$ of the column virtual line and the row vertual line were set to 10%, the degrees of variation $T_x$ and $T_y$ of the vertex position in the x and y directions were set to 10%, and the degree of variation r in the radius of curvature of the micro-lens was set to 10%.

The (c) of the FIG. 10 is a distribution diagram of the inclination angle of the main side of the micro-lens array according to Example 2 with respect to the row virtual line or the column virtual line. In Example 2, the inclination angles θ1, θ2, θ3, and θ4 of the main side with respect to the row virtual line or the column virtual line were within a range of −11.7° or more and 11.7° or less.

Figure 13:
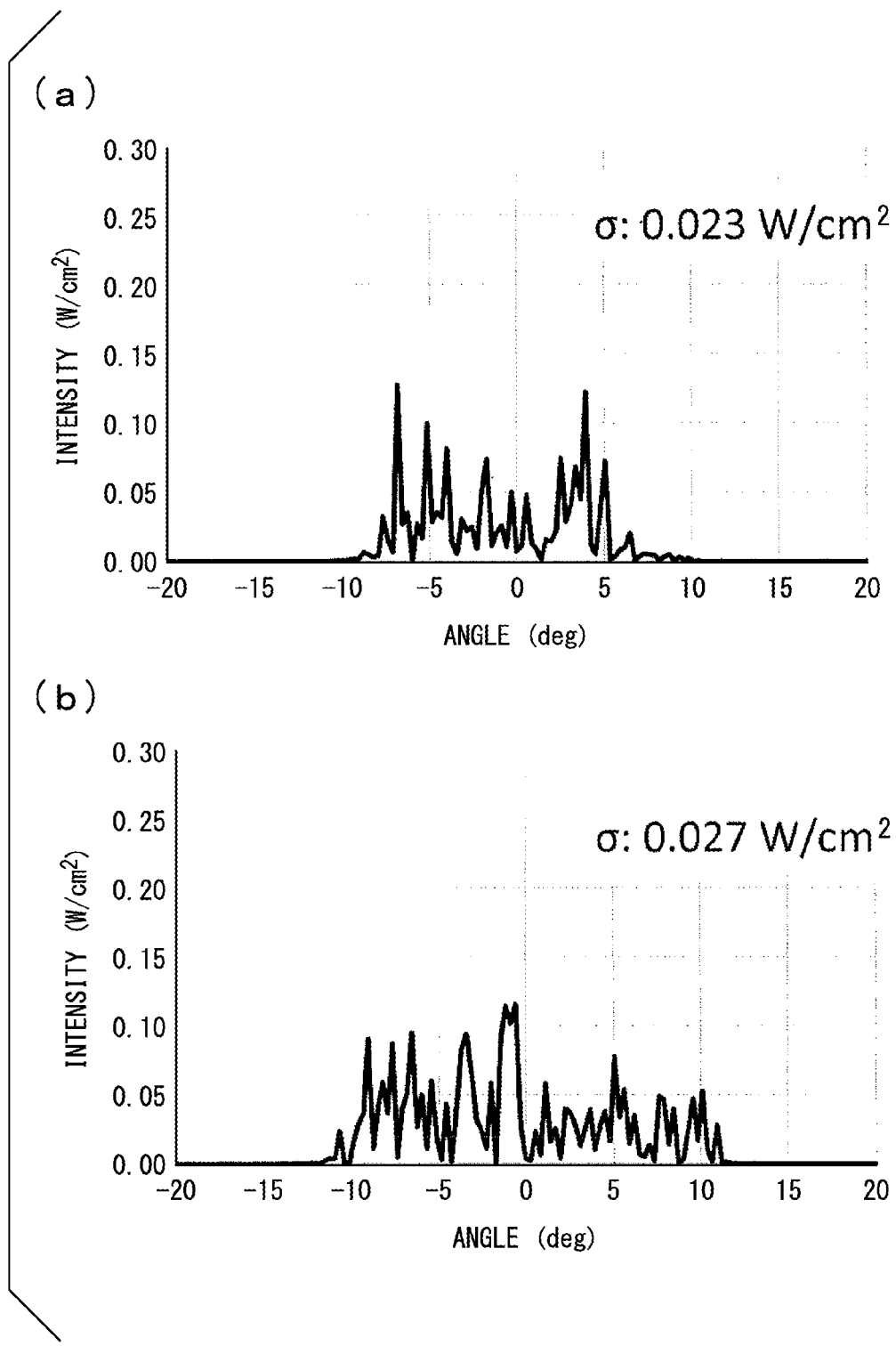
FIG. 13 is a diffusion characteristic of the micro-lens array according to Example 2.

FIG. 13 is a diffusion characteristic of the micro-lens array according to Example 2. The (a) of the FIG. 13 shows the diffusion characteristics in the x direction, and the (b) of the FIG. 13 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.023 W/cm², and the standard deviation $\sigma_{xy}$ of the diffusion intensity in the x direction was 0.027 W/cm². Further, the 10% angle width in the x direction was 16.6°, and the 10% angular width in the xy direction was 22.0°. The ratio of the 10% angle width in the x direction to the 10% angle width in the xy directions was 0.75.

In Example 3, the degrees of variation $g_x$ and $g_y$ of the column virtual line and the row vertual line were set to 20%, the degrees of variation $T_x$ and $T_y$ of the vertex position in the x and y directions were set to 20%, and the degree of variation r in the radius of curvature of the micro-lens was set to 20%.

The (d) of the FIG. 10 is a distribution diagram of the inclination angle of the main side of the micro-lens array according to Example 3 with respect to the row virtual line or the column virtual line. In Example 3, the inclination angles θ1, θ2, θ3, and θ4 of the main side with respect to the row virtual line or the column virtual line were within a range of −12.5° or more and 12.5° or less.

Figure 14:
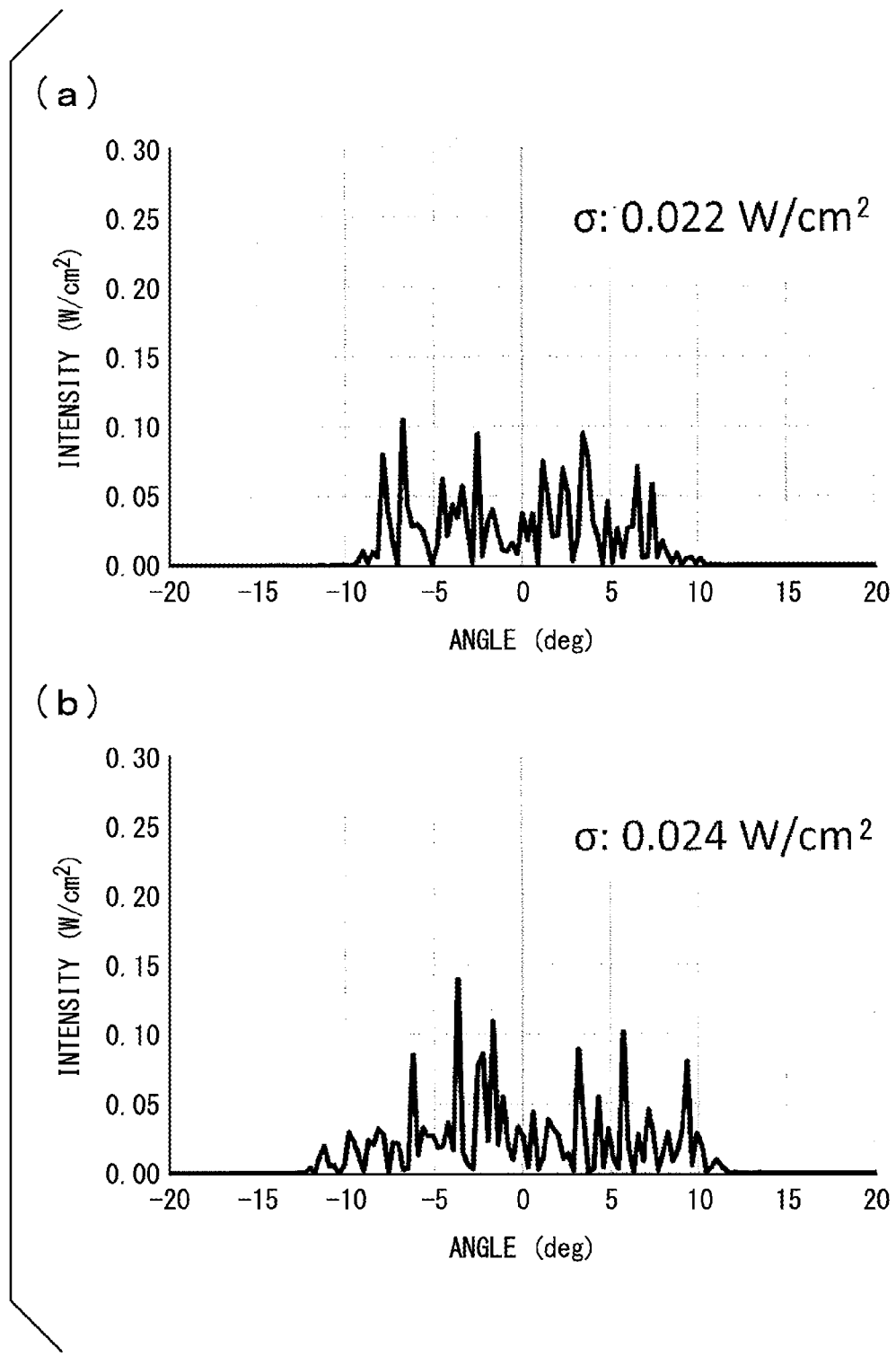
FIG. 14 is a diffusion characteristic of the micro-lens array according to Example 3.

FIG. 14 is a diffusion characteristic of the micro-lens array according to Example 3. The (a) of the FIG. 14 shows the diffusion characteristics in the x direction, and the (b) of the FIG. 14 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.022 W/cm², and the standard deviation $\sigma_{xy}$ of the diffusion intensity in the x direction was 0.024 W/cm². Further, the 10% angle width in the x direction was 18.0°, and the 10% angular width in the xy direction was 22.0°. The ratio of the 10% angle width in the x direction to the 10% angle width in the xy directions was 0.82.

In Example 4, the degrees of variation $g_x$ and $g_y$ of the column virtual line and the row vertual line were set to 30%, the degrees of variation $T_x$ and $T_y$ of the vertex position in the x and y directions were set to 30%, and the degree of variation r in the radius of curvature of the micro-lens was set to 30%.

The (e) of the FIG. 10 is a distribution diagram of the inclination angle of the main side of the micro-lens array according to Example 4 with respect to the row virtual line or the column virtual line. In Example 4, the inclination angles θ1, θ2, θ3, and θ4 of the main side with respect to the row virtual line or the column virtual line were within a range of −19.3° or more and 19.3° or less.

Figure 15:
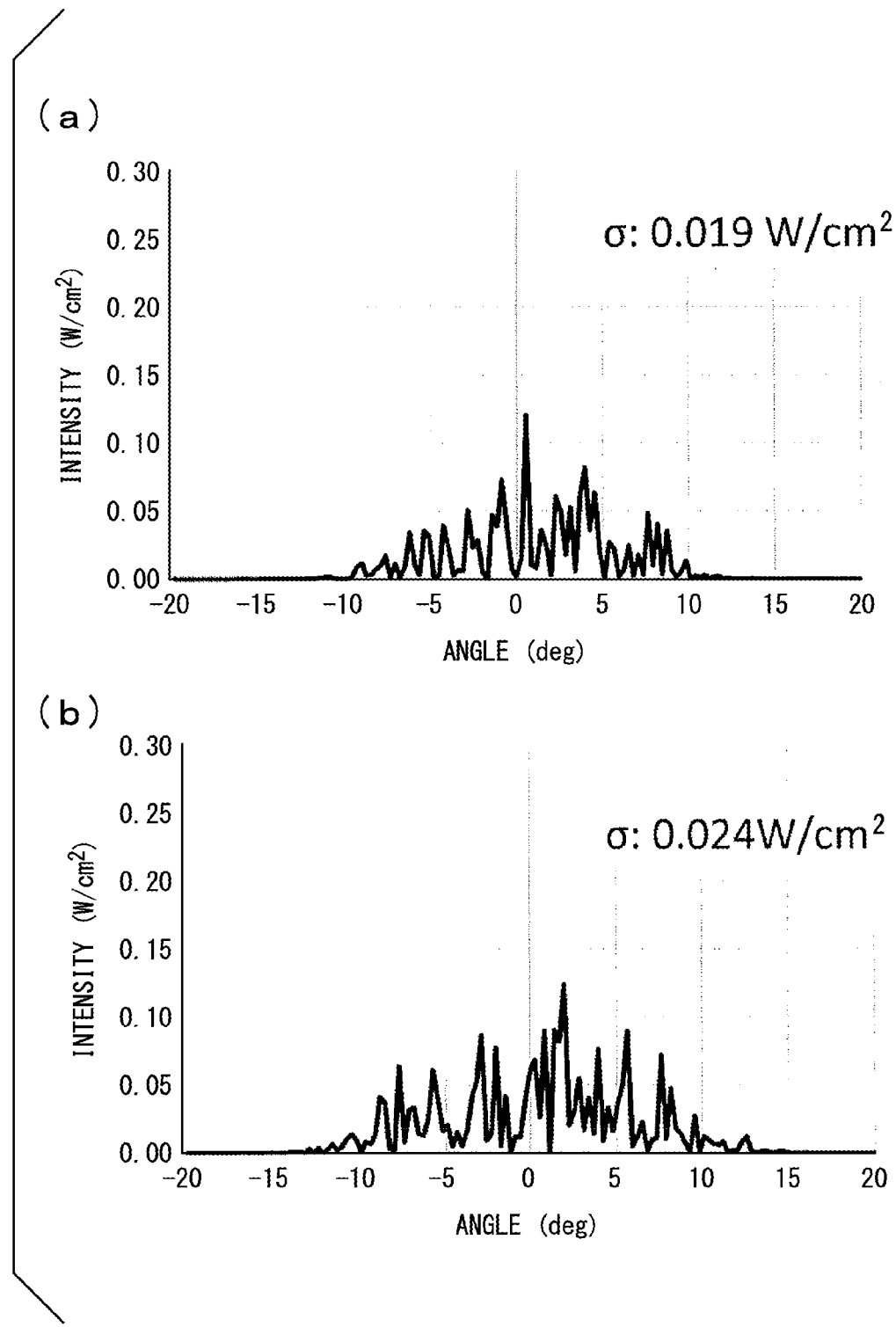
FIG. 15 is a diffusion characteristic of the micro-lens array according to Example 4.

FIG. 15 is a diffusion characteristic of the micro-lens array according to Example 4. The (a) of the FIG. 15 shows the diffusion characteristics in the x direction, and the (b) of the FIG. 15 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.019 W/cm², and the standard deviation $\sigma_{xy}$ of the diffusion intensity in the x direction was 0.024 W/cm². Further, the 10% angle width in the x direction was 18.5°, and the 10% angular width in the xy direction was 23.2°. The ratio of the 10% angle width in the x direction to the 10% angle width in the xy directions was 0.80.

In Example 5, the degrees of variation $g_x$ and $g_y$ of the column virtual line and the row vertual line were set to 40%, the degrees of variation $T_x$ and $T_y$ of the vertex position in the x and y directions were set to 40%, and the degree of variation r in the radius of curvature of the micro-lens was set to 40%.

The (f) of the FIG. 10 is a distribution diagram of the inclination angle of the main side of the micro-lens array according to Example 5 with respect to the row virtual line or the column virtual line. In Example 5, the inclination angles θ1, θ2, θ3, and θ4 of the main side with respect to the row virtual line or the column virtual line were within a range of −27.7° or more and 27.7° or less.

Figure 16:
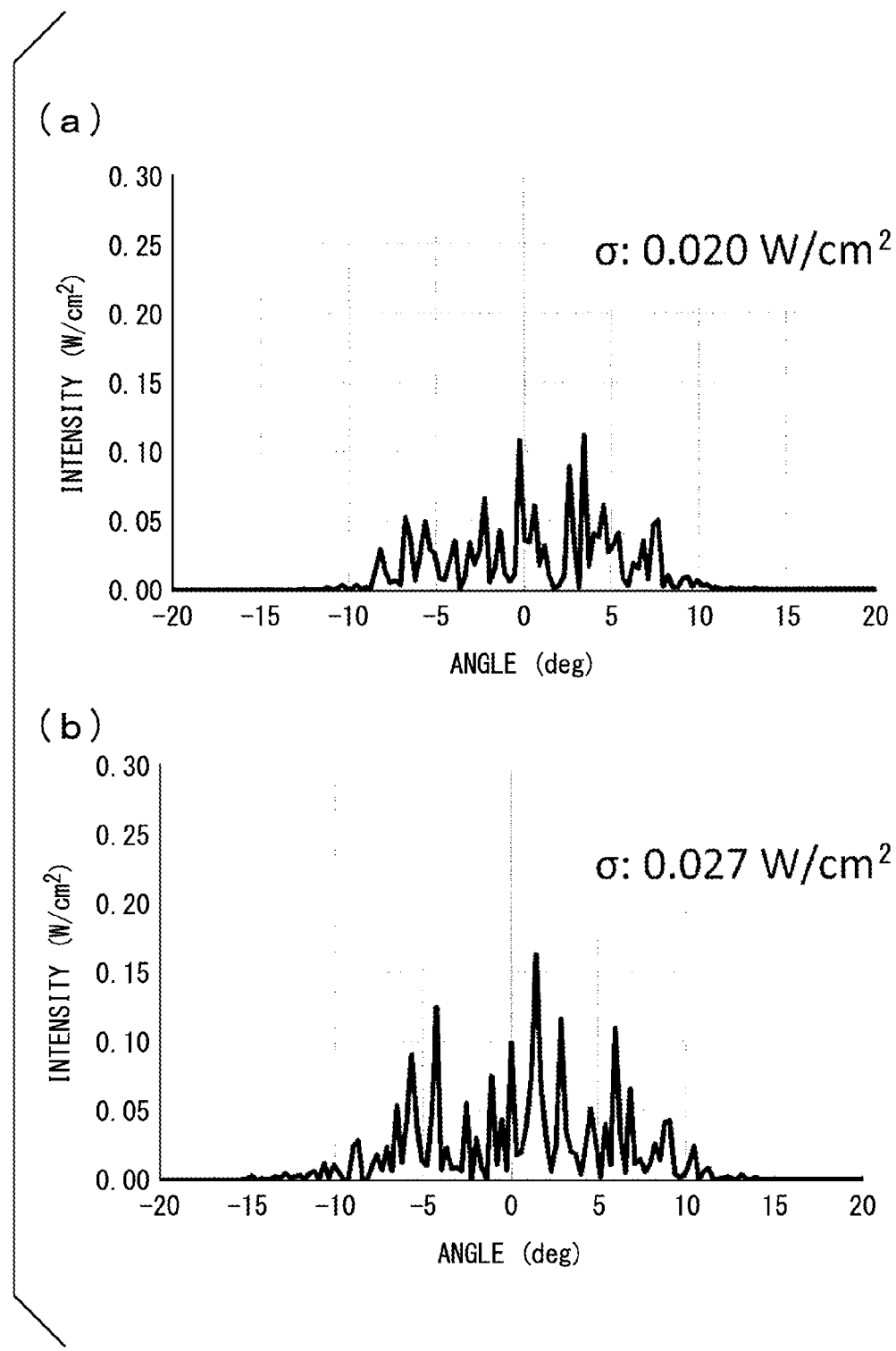
FIG. 16 is a diffusion characteristic of the micro-lens array according to Example 5.

FIG. 16 is a diffusion characteristic of the micro-lens array according to Example 5. The (a) of the FIG. 16 shows the diffusion characteristics in the x direction, and the (b) of the FIG. 16 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.020 W/cm², and the standard deviation $\sigma_{xy}$ of the diffusion intensity in the x direction was 0.027 W/cm². Further, the 10% angle width in the x direction was 19.4°, and the 10% angular width in the xy direction was 22.0°. The ratio of the 10% angle width in the x direction to the 10% angle width in the xy directions was 0.88.

In Example 6, the degrees of variation $g_x$ and $g_y$ of the column virtual line and the row vertual line were set to 50%, the degrees of variation $T_x$ and $T_y$ of the vertex position in the x and y directions were set to 50%, and the degree of variation r in the radius of curvature of the micro-lens was set to 50%.

The (g) of the FIG. 10 is a distribution diagram of the inclination angle of the main side of the micro-lens array according to Example 6 with respect to the row virtual line or the column virtual line. In Example 6, the inclination angles θ1, θ2, θ3, and θ4 of the main side with respect to the row virtual line or the column virtual line were within a range of −35.9° or more and 35.9° or less.

Figure 17:
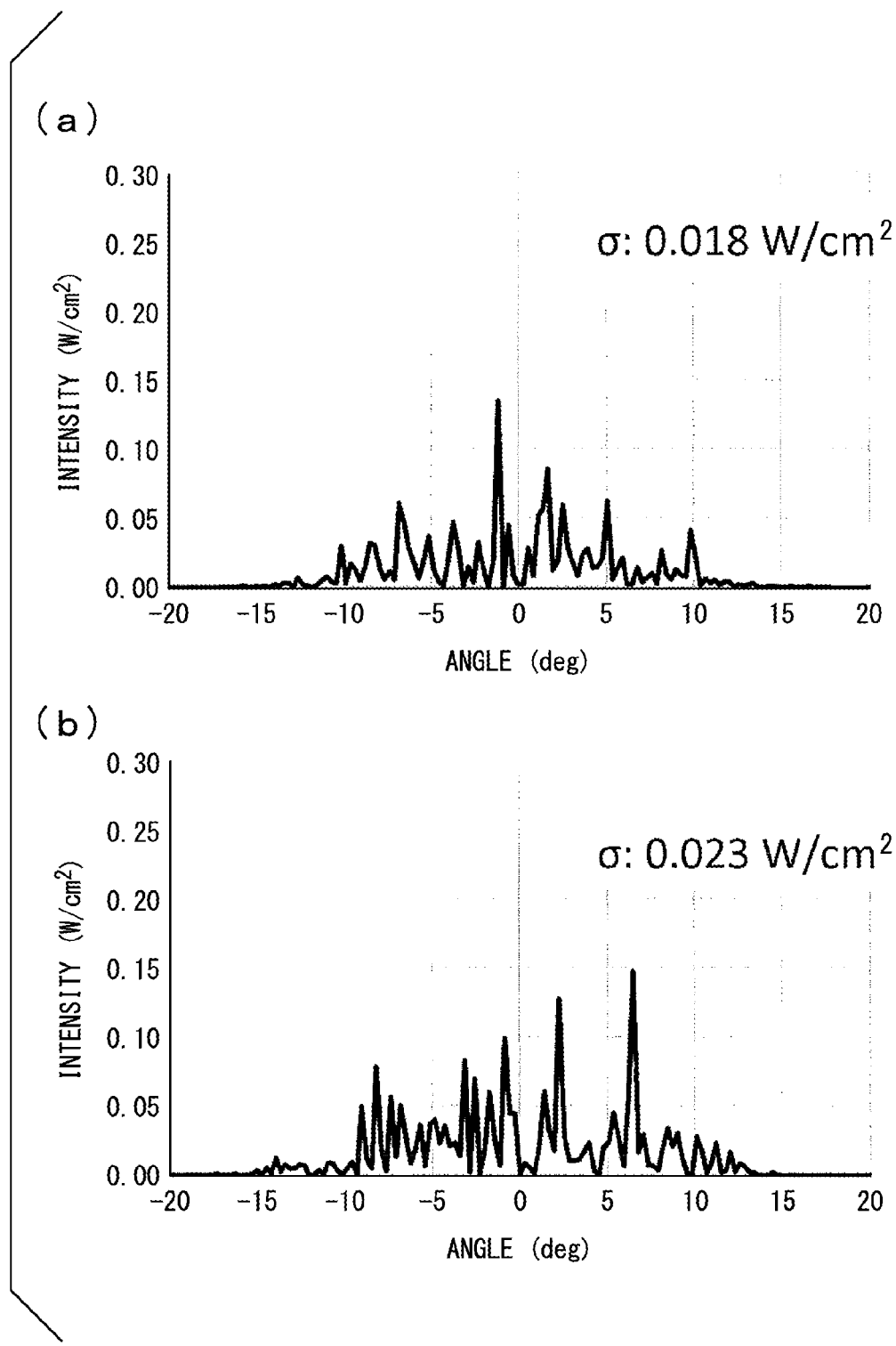
FIG. 17 is a diffusion characteristic of the micro-lens array according to Example 6.

FIG. 17 is a diffusion characteristic of the micro-lens array according to Example 6. The (a) of the FIG. 17 shows the diffusion characteristics in the x direction, and the (b) of the FIG. 17 shows the diffusion characteristics in the xy direction. The horizontal axis is the angle with respect to the incident light, and the vertical axis is the intensity of the diffused light. The standard deviation $\sigma_x$ of the diffusion intensity in the x direction was 0.018 W/cm², and the standard deviation $\sigma_{xy}$ of the diffusion intensity in the x direction was 0.023 W/cm². Further, the 10% angle width in the x direction was 23.2°, and the 10% angular width in the xy direction was 23.2°. The ratio of the 10% angle width in the x direction to the 10% angle width in the xy directions was 1.00.

Comparative Example 2

Comparative Example 2 is different from Comparative Example 1 in that the micro-lenses are not arranged and are randomized. The average distance between the vertices of the adjacent micro-lenses was 80 μm, and the average radius of curvature of the micro-lenses was 150 μm. The refractive index of the substrate for light having a wavelength of 450 nm was 1.47, as in Comparative Example 1. The diffused light was circular because the micro-lenses were not arranged.

Figure 18:
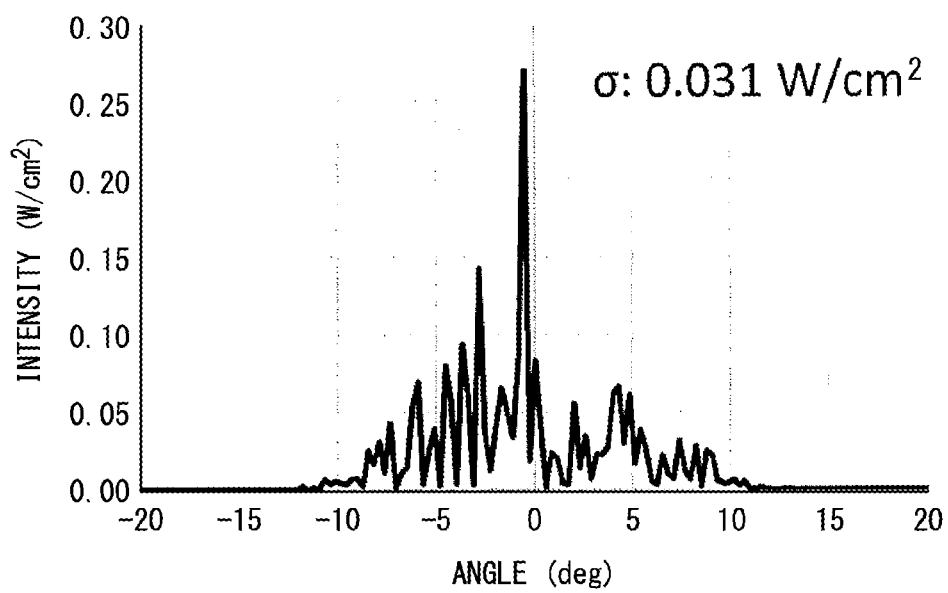
FIG. 18 is a diffusion characteristic of the micro-lens array according to Comparative Example 2.

FIG. 18 is the diffusion characteristics of the micro-lens array according to Comparative Example 2. FIG. 18 shows the diffusion characteristics in an arbitrary position direction (for example, the x direction). Since the diffused light is circular, the diffusion characteristics are almost the same in any directions. The horizontal axis is the angle with respect to the incident light, and the vertical axis is the intensity of the diffused light. The standard deviation 6 of the diffusion intensity was 0.031 W/cm². Further, the 10% angle width in the x direction was 22.5°, and the 10% angle width in the xy direction was 22.4°. The ratio of the 10% angular width in the x direction to the 10% angular width in the xy directions was 1.00.

The above-described manufacturing conditions are summarized in Table 1, and the characteristics of the manufactured micro-lens array are summarized in Table 2.

TABLE 1

| | Design parameters | | | | | | | |
|---|---|---|---|---|---|---|---|---|
| | Gx (μm) | gx (%) | Gy (μm) | gy (%) | Tx (%) | Ty (%) | R (μm) | R (%) |
| Comparative Example 1 | 80 | 0 | 80 | 0 | 0 | 0 | 150 | 0 |
| Example 1 | 80 | 5 | 80 | 5 | 5 | 5 | 150 | 5 |
| Example 2 | 80 | 10 | 80 | 10 | 10 | 10 | 150 | 10 |
| Example 3 | 80 | 20 | 80 | 20 | 20 | 20 | 150 | 20 |
| Example 4 | 80 | 30 | 80 | 30 | 30 | 30 | 150 | 30 |
| Example 5 | 80 | 40 | 80 | 40 | 40 | 40 | 150 | 40 |
| Example 6 | 80 | 50 | 80 | 50 | 50 | 50 | 150 | 50 |
| Comparative Example 2 | — | — | — | — | — | — | — | — |

TABLE 2

| | Range of inclination angle | Standard deviation of intensity (W/cm²) | | 10% angle width (°) | | |
|---|---|---|---|---|---|---|
| | | $\sigma_x$ | $\sigma_{xy}$ | x | xy | x/xy |
| Comparative Example 1 | θ = 0° | 0.039 | 0.039 | 15.6 | 22.9 | 0.68 |
| Example 1 | −3.7° ≤ θ ≤ 3.7° | 0.025 | 0.028 | 16.2 | 22.7 | 0.71 |
| Example 2 | −11.7° ≤ θ ≤ 11.7° | 0.023 | 0.027 | 16.6 | 22.0 | 0.75 |
| Example 3 | −12.5° ≤ θ ≤ 12.5° | 0.022 | 0.024 | 18.0 | 22.0 | 0.82 |
| Example 4 | −19.3° ≤ θ ≤ 19.3° | 0.019 | 0.024 | 18.5 | 23.2 | 0.8 |
| Example 5 | −27.7° ≤ θ ≤ 27.7° | 0.020 | 0.027 | 19.4 | 22.0 | 0.88 |
| Example 6 | −35.9° ≤ θ ≤ 35.9° | 0.018 | 0.023 | 23.2 | 23.2 | 1.00 |
| Comparative Example 2 | Circular diffusion plate | 0.031 | | 22.5 | 22.4 | 1.00 |

When one side of a square is set to 1, the length of a diagonal line thereof is about 1.414. That is, the ratio of the length in the x direction divided by the length in the xy direction is about 0.70. That is, as the ratio of the angle width of the diffused light of the micro-lens array in the x direction to the angle width thereof in the xy direction becomes closer to 0.70, a shape of the diffused light becomes quadrangular. It can be said that in Examples 1 to 5, the diffused light is closer to a quadrangle as compared with Comparative Example 2. In Example 6, it can be said that the diffused light approaches a circular shape, but the standard deviation of the intensity is smaller than that of Comparative Example 2, and uniformity of the intensity of the diffused light is enhanced.

Figure 19:
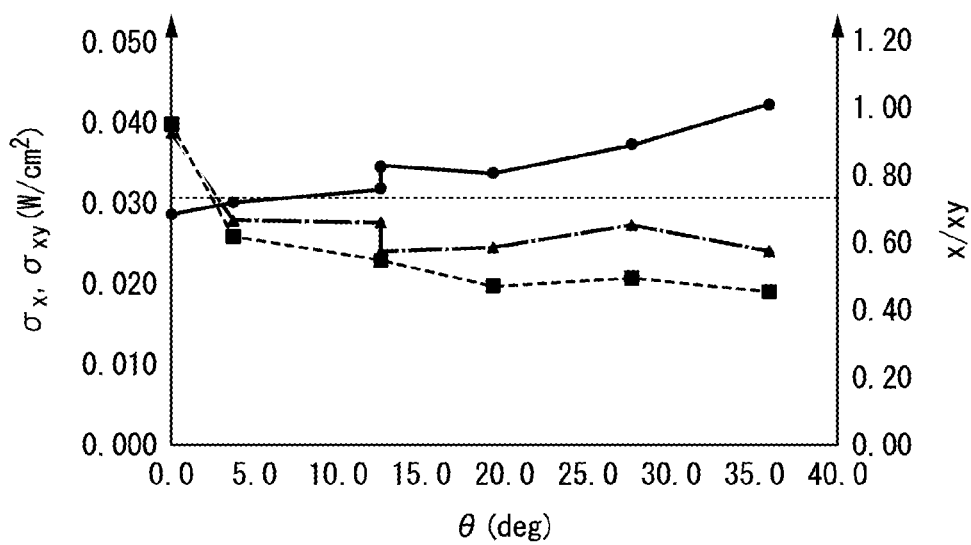
FIG. 19 is a graph summarizing results of the diffusion characteristics of Examples 1 to 6 and Comparative Examples 1 and 2.

Further, FIG. 19 summarizes results of the optical characteristics of Examples 1 to 6, Comparative Example 1 and Comparative Example 2. Circular dots in FIG. 19 are results of plotting x/xy in Examples 1 to 6 and Comparative Example 1, triangular dots are results of plotting the standard deviation $\sigma_{xy}$ of the intensity in the xy directions in Examples 1 to 6 and Comparative Example 1, and square dots are results of plotting the standard deviation $\sigma_x$ of the intensity in the x direction in Examples 1 to 6 and Comparative Example 1. In addition, the standard deviation of the micro-lens array of Comparative Example 2 which is 0.031 W/cm$^2$ is also shown in the graph. The micro-lens arrays of Examples 1 to 6 show that both of the standard deviations $\sigma_x$ and $\sigma_{xy}$ of the intensity in the x direction and the xy direction are smaller than the standard deviation of the micro-lens array of Comparative Example 2, and the diffused light diffused from the micro-lens arrays of Examples 1 to 6 is uniform.

EXPLANATION OF REFERENCES

10 Micro-lens
10a Curved surface
10c, c Center
10v Vertex
11, 12 Antireflection film
100, 101 Micro-lens array
CL Column virtual line
RL Row virtual line
m1, m2, m3, m4 Main side
s Sub-side
PJ Projection type image display device

What is claimed is:
1. A projection type image display device comprising:
a light source;
a first diffusion plate;
a second diffusion plate; and
a screen;
wherein the first diffusion plate and the second diffusion plate are arranged in series between the light source and the screen on an optical path from the light source to the screen,
both the first diffusion plate and the second diffusion plate have a micro-lens array,
the micro-lens array has a plurality of micro lenses arranged in a matrix in a plan view,
each of the plurality of micro-lenses has four main sides or four main sides and one or more sub-sides which connect two main sides of the four main sides in a plan view,
each of the four main sides is inclined with respect to a row virtual line parallel to a row direction or a column virtual line parallel to a column direction,
each of the four main sides has an inclination angle θ in a predetermined range with respect to the row virtual line or the column virtual line, and
an absolute value of the inclination angle θ is $2.5° \leq \theta \leq 27.7°$.

2. The projection type image display device according to claim 1, wherein each of the plurality of micro-lenses is a concave lens which is recessed with respect to a reference surface.

3. The projection type image display device according to claim 1, the micro-lens array further comprising an antireflection film,
wherein the antireflection film is laminated on at least one of a first surface on which the plurality of micro-lenses are disposed and a second surface which faces the first surface.

4. A projection type image display device comprising:
a light source;
a first diffusion plate;
a second diffusion plate; and
a screen;
wherein the first diffusion plate and the second diffusion plate are arranged in series between the light source and the screen on an optical path from the light source to the screen,
both the first diffusion plate and the second diffusion plate have a micro-lens array,
the micro-lens array has a plurality of micro lenses arranged in a matrix in a plan view,
each of the plurality of micro-lenses has four main sides in a plan view,
each of the four main sides is inclined with respect to a row virtual line parallel to a row direction or a column virtual line parallel to a column direction, and
the degree of variation of the intervals between the row virtual lines and between the column virtual lines, the positions of the vertices of the respective micro-lenses, and the radii of curvature of the respective micro-lenses with respect to a basic pattern is between 5% and 40%, respectively.

* * * * *